(12) United States Patent
Bordonado (10) Patent No.: US 9,877,394 B2
(45) Date of Patent: Jan. 23, 2018

(54) CONNECTION SYSTEM OF A CONDUCTIVE BUSBAR TO AN ELECTRIC COMPONENT

(71) Applicant: Schneider Electric Industries SAS, Rueil Malmaison (FR)

(72) Inventor: Franck Bordonado, Satolas et Bonce (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 15/420,875

(22) Filed: Jan. 31, 2017

(65) Prior Publication Data

US 2017/0257949 A1    Sep. 7, 2017

(30) Foreign Application Priority Data

Mar. 4, 2016    (FR) .................... 16 51823

(51) Int. Cl.

| H05K 1/00 | (2006.01) |
|---|---|
| H05K 1/18 | (2006.01) |
| H01F 27/06 | (2006.01) |
| H01R 4/02 | (2006.01) |
| H01R 12/70 | (2011.01) |
| H01R 12/75 | (2011.01) |

(Continued)

(52) U.S. Cl.
CPC ............. *H05K 1/181* (2013.01); *H01F 27/06* (2013.01); *H01R 4/02* (2013.01); *H01R 4/48* (2013.01); *H01R 11/28* (2013.01); *H01R 12/58* (2013.01); *H01R 12/7088* (2013.01); *H01R 12/75* (2013.01); *H01R 25/165* (2013.01); *H02G 5/02* (2013.01); *H01F 2027/065* (2013.01); *H01R 2201/22* (2013.01); *H05K 2201/1003* (2013.01); *H05K 2201/10272* (2013.01)

(58) Field of Classification Search
CPC   H05K 2201/1059; H05K 1/181; H01F 27/06; H01R 4/02; H01R 4/48; H01R 11/28; H01R 12/58; H01R 12/7088; H01R 12/75; H01R 12/165; H02G 5/02
USPC ...................... 439/79, 857, 947, 290, 82, 84
See application file for complete search history.

(56) References Cited

U.S. PATENT DOCUMENTS 3,681,738 A * 8/1972 Friend .................... H01R 12/58
174/263
5,618,187 A * 4/1997 Goto .................... H01R 25/162
439/79

(Continued)

FOREIGN PATENT DOCUMENTS

| CA | 2 438 678 A1 | 2/2005 |
|---|---|---|
| DE | 20 2009 006 254 U1 | 7/2009 |

OTHER PUBLICATIONS

French Preliminary Search Report issued Oct. 25, 2016 in French Application 16 51823, filed on Mar. 4, 2016 (with English Translation of Categories of cited documents).

*Primary Examiner* — Steven T Sawyer
(74) *Attorney, Agent, or Firm* — Oblon, McClelland, Maier & Neustadt, L.L.P.

(57) ABSTRACT

A mechanical and electrical connection system including a printed circuit board, a busbar and an electrical component, wherein the board includes a first orifice in which a bottom foot of the bar is received and includes a second orifice in which a lug of the component is received, and wherein the bar includes an elastically deformable clamp which receives the lug of the component.

10 Claims, 5 Drawing Sheets

(51) Int. Cl.
*H01R 25/16* (2006.01)
*H02G 5/02* (2006.01)
*H01R 4/48* (2006.01)
*H01R 11/28* (2006.01)
*H01R 12/58* (2011.01)

(56) References Cited

U.S. PATENT DOCUMENTS

| | | | | |
|---|---|---|---|---|
| 5,796,588 | A * | 8/1998 | Machida | H01M 2/20 |
| | | | | 361/773 |
| 5,807,121 | A * | 9/1998 | Fulop | H01R 12/58 |
| | | | | 439/82 |
| 8,075,322 | B2 | 12/2011 | Schwettmann et al. | |
| 2005/0136713 | A1* | 6/2005 | Schell | H01R 13/055 |
| | | | | 439/140 |
| 2005/0250390 | A1 | 11/2005 | MacDonald | |
| 2010/0279523 | A1 | 11/2010 | Schwettmann et al. | |

* cited by examiner

CONNECTION SYSTEM OF A CONDUCTIVE BUSBAR TO AN ELECTRIC COMPONENT

TECHNICAL FIELD

The invention relates to a mechanical and electrical connection system for connecting a power transmission bulbar to an electrical component.

The invention relates more particularly to a connection system for a module of an electrical installation, comprising an electrical current transformer mounted on a printed circuit board, which is linked to a connector of the module by busbars for the transmission of high currents.

PRIOR ART

A medium-voltage power grid network notably comprises a protection cell made up of a plurality of modules having different functions such as, for example, input/output, power supply, current/voltage communication or acquisition functions. That makes it possible to offer a wide range of applications for the medium-voltage networks.

One of these modules, which is the current/voltage acquisition module, consists of an electrical installation comprising, as main components:

a current transformer (CT), a client connector which makes it possible to connect the primary of the transformer, an analogue conversion chain and a connector linking to the motherboard. These components are mounted on a printed circuit board.

The primary circuit of the transformer is passed through by a current of high intensity. That means using conductors of large section to produce this circuit.

The wiring of the module using conductors in the form of electric wires is done manually by an operator, which involves a risk of error, and complexity in running the cables influencing the performance of the module, notably for so-called crosstalk problems.

In addition, such a wiring method has a cost which increases with the complexity of the operation.

Connecting components using busbars involves folding each bar as the wiring proceeds.

Also, the rigidity of the bars makes their connection to the transformer difficult and technically complex in practice, without systematically guaranteeing a mechanical link.

The aim of the invention is to propose a mechanical and electrical connection system for connecting a busbar to any other electrical component, such as the current transformer, which is simple to implement and which ensures reliable mechanical and electrical connections.

SUMMARY OF THE INVENTION

The invention relates to a mechanical and electrical connection system comprising a printed circuit board, a busbar and an electrical component, characterized in that the board comprises a first orifice in which a bottom foot of the bar is received and comprises a second orifice in which a lug of the component is received, and in that the bar comprises an elastically deformable clamp which receives the lug of the component.

The combination of the two orifices of the board, which each cooperate with the bar or with the lug of the electrical component and the clamp of the busbar makes it possible to have a link that is both mechanical and electrical between the bar and the electrical component which is safe and effective.

Preferably, the clamp comprises a bottom part which is received in the second orifice with the lug of the component.

Preferably, the board comprises a continuous layer of conducting material formed at the orifices and which covers at least a bottom face of the board, surrounding the openings of the orifices, and which can also cover the top face of the board and the walls of the orifices.

Preferably, a part of the layer of conducting material, which covers a bottom face of the board, is covered with a solder material.

Preferably, the clamp is made up of at least two hooks jointly delimiting a cylindrical housing and which can be moved apart when the lug is introduced into said housing.

Preferably, each hook comprises at least one tongue extending parallel to the main axis of the housing, of which the bottom end of each tongue is situated vertically below a bottom face of the board and protrudes to the outside relative to the hook.

Preferably, the busbar is made up of two half-bars which are distributed on either side of a median vertical longitudinal plane of the bar and which are linked to one another at their top end edge by a fold line.

Preferably, each half-bar comprises a hook and one half of the foot.

Preferably, the fold line forms a discontinuous line and comprises a plurality of windows distributed longitudinally along the fold line.

Preferably, the busbar is produced by folding a flank made of conducting material which has previously been cut and stamped.

BRIEF DESCRIPTION OF THE DRAWINGS

Other features and advantages of the invention will become apparent on reading the following detailed description, for an understanding of which reference will be made to the attached drawings in which.

DETAILED EXPLANATION OF PARTICULAR EMBODIMENTS

For the description of the invention, the vertical, longitudinal and transverse orientations according to the reference frame V, L, T indicated in the figures will be adopted in a nonlimiting manner.

In the following description, elements that are identical, similar or analogous will be designated by the same reference numerals.

Figure 1:
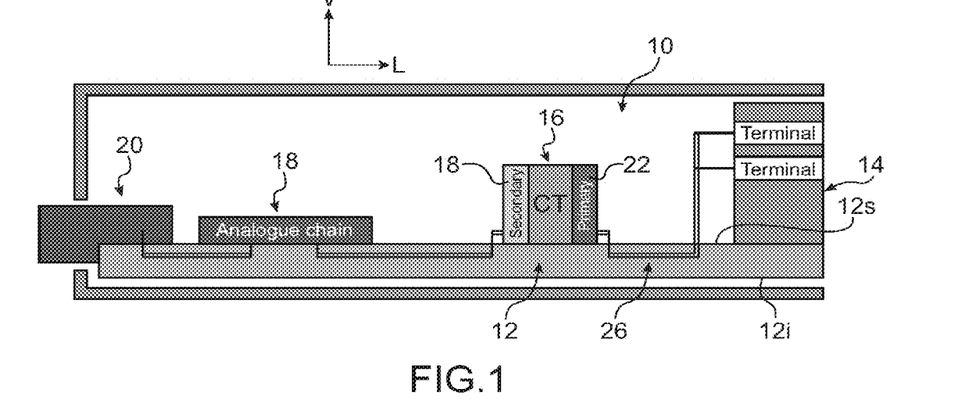
FIG. 1 is a schematic representation of a module comprising a component and a connecting bar linked according to the electrical structure according to the invention.

FIG. 1 shows a module 10 for a protection cell intended to be installed in a medium voltage power grid line. This module 10 is, for example, a current/voltage acquisition module.

The module 10 comprises a printed circuit board 12 on which many electronic components are mounted.

In the following description, it will be considered that the board 12 extends along a horizontal main plane with the longitudinal direction from front to back being the direction from right to left when referring to FIG. 1.

The module 10 here comprises a front connector 14 for mounting and connecting the module 10 in the cell, a current transformer 16, an analogue conversion chain 18 and a rear connector 20 for connecting the module 10 to a motherboard of the cell.

The transformer 16 comprises a primary circuit 22 which is connected to the front connector 14 and a secondary circuit 24 connected to the analogue conversion chain 18. The current which flows between the front connector 14 and the primary circuit 22 is taken directly from the secondary circuit of another current transformer (not represented) installed in the cell and is conveyed by conductors 26.

The various components of the module 10 are here represented as being mounted on one and the same top face 12s of the board, its bottom face 12i being empty.

It will be understood that the module 10 can comprise other components mounted on this bottom face 12i of the board 12, in addition to those mounted on its top face 12s.

The intensity of this current can exhibit significant peaks, of the order of several tens of amperes, that the conductors 26 must be capable of supporting.

Figure 2:
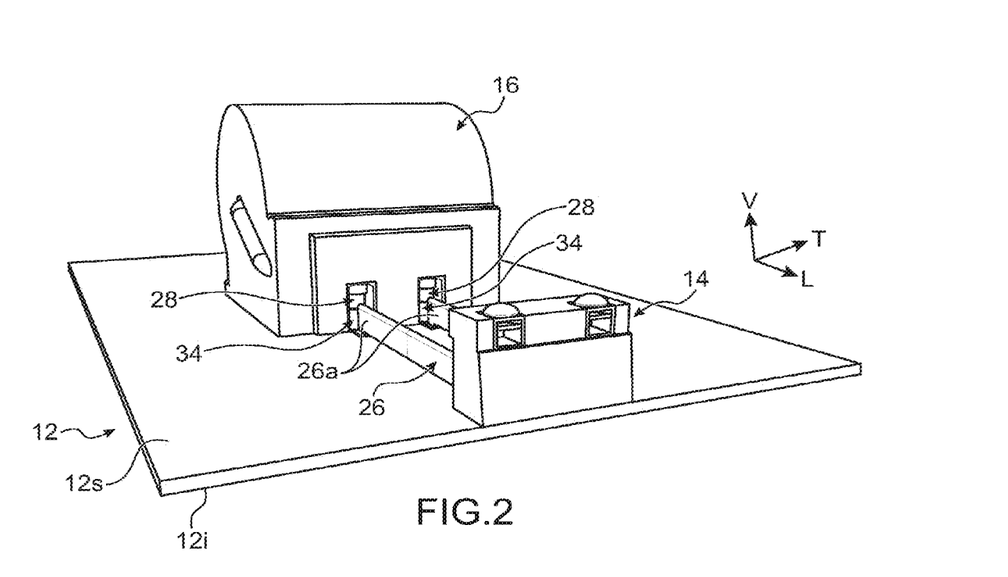
FIG. 2 is a perspective detail of a part of the module represented in FIG. 1, showing the structure according to the invention.

As can be seen in FIG. 2 and subsequent figures, each conductor 26 consists of a bar whose section is of primarily rectangular form, the long length of its section being vertical.

According to the embodiment represented in FIG. 2, each bar 26 extends longitudinally. It will be understood that the invention is not limited to this configuration of the bars 26, which can be folded according to different angles, as represented for example in FIG. 7.

Each end of a bar 26 is linked to a component of the module 10, that is to say, here, a first longitudinal end 26a of the bar 26 is linked to the transformer 16, the second end 26b of the bar 26 is linked to the front connector 14.

In the following description, reference will be made to a system producing the connection of the first end 26a of a bar 26 to the transformer 16. It will be understood that this description can be applied also to the link of the first end 26a or the second end 26b of a bar 26 with another electrical component of the module 10. This electrical component possibly also being an electronic component.

Also, in order to simplify the description, it will be considered that the first end 26a of the bar 26 is oriented longitudinally. It will be understood that this orientation is not limiting and that an end of a bar 26 can be oriented differently without departing from the scope of the invention, while remaining parallel to the main plane of the board 12.

Figure 3:
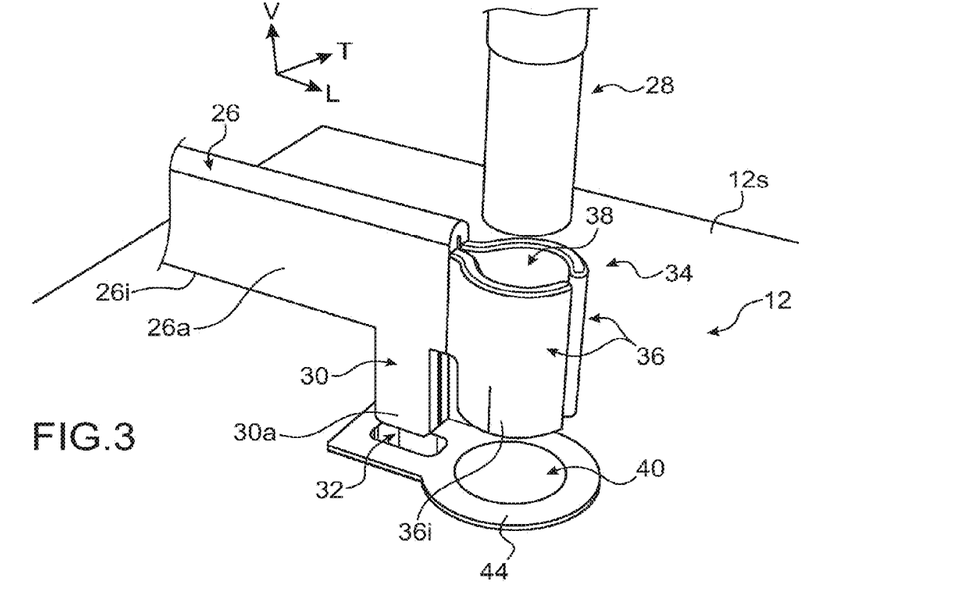
FIG. 3 is a larger scale exploded view of the detail represented in FIG. 2, showing the different components of the electrical structure before their assembly.

As can be seen in more detail in FIG. 3, for its link with the bar 26, the electrical component which, here, is the transformer 16, comprises a connecting lug 28.

This lug 28 is cylindrical of revolution and its main axis is vertical at right angles to the horizontal plane of the board 12.

The end 26a of the bar 26 is produced to implement its mechanical link with the lug 28 and with the board 12, and to produce the electrical connection of the bar 26 with the lug 28.

The mechanical link of the end 26a of the bar 26 with the board 12 is produced by a foot 30 which extends vertically downward from a bottom edge 26i of the bar 26. The foot 30 is introduced into a first complementary orifice 32 formed in the board 12.

Preferably, the vertical length of the foot 30 is greater than the thickness of the board 12.

Thus, when the bar 26 is in position on the board 12, the free bottom end 30a of the foot 30 protrudes vertically downward relative to the bottom face 12i of the board 12.

This protruding part makes it possible to provide a contact surface available for the application of solder in order in particular to fix the bar 26 to the board 12.

The mechanical link of the end 26a of the bar 26 with the lug 28 is produced by a clamp 34 which is situated at the end of the end 26a of the bar 26 and which receives the lug 28.

Preferably, the clamp 34 is elastically deformable, to produce a grip on the lug 28.

For that, the clamp 34 is made up of two hooks 36, which longitudinally extend the end 26a of the bar 26 and of which the free longitudinal ends of the hooks 36 are transversely separated from one another.

According to the embodiment represented in the figures, the hooks 36 are arranged symmetrically relative to one another relative to a median vertical longitudinal plane of the end 26a of the bar 26.

It will be understood that the invention is not limited to this embodiment of the clamp 34, which can comprise a different number of hooks 36 or else the hooks 36 may not be symmetrical relative to the median main plane of the end 26a of the bar 26.

When the clamp 34 is empty, as is notably the case in the view of FIG. 3, the transverse dimension of the housing 38 defined by the clamp 34 is less than the transverse width of the lug 28, that is to say less than the diameter of the lug 28. Thus, when the lug 28 is introduced into the clamp 34, it provokes a separation of the two hooks 36 in the transverse direction.

This separation of the hooks 36 is limited by the diameter of the orifice 40, that is to say that the hooks 36 come into abutment against the internal face of the orifice 40.

The lug 28 is thus force-fitted into the housing 38.

The result thereof is that the residual assembly play between the orifice 40, the hooks 36 and the lug 28 is virtually nil which makes it possible to keep the hooks 36 bearing permanently on the lug 28.

This bearing makes it possible to produce a mechanical link of the lug 28 with the end 26a of the bar 26, and an electrical link since the clamp 34 is produced of a single piece with the end 26a of the bar 26, in an electrically conducting material.

According to another aspect of the link of the end 26a of the bar 26 with the lug 28, making it possible to maintain this link, the board 12 comprises a second orifice 40 in which the lug 28 is received.

According to a preferred embodiment, a part of the clamp 34 is also received in this orifice, with the lug 28.

To this end, each hook 36 of the clamp 34 extends vertically downward beyond the bottom edge 26i of the end 26a of the bar 26 and the bottom end 36i of each hook 36 is received in the second orifice 40.

Also, the lug 28 is inserted into the clamp 34 and into the second orifice 40 so that its bottom end 28i protrudes vertically downward relative to the bottom face 12*i* of the board 12. This part of the lug 28 which is protruding is available to be covered by a layer of solder which makes it possible to fix together the lug 28, the board 12 and the clamp 34.

Preferably, the diameter of the second orifice 40 is substantially equal to the outer diameter of the clamp 34 when it receives the lug 28.

Thus, when the lug 28 is introduced into the clamp 34, after having previously mounted the end 26*a* of the bar 26 on the board, the hooks 36 are separated from one another and come to bear against the internal walls of the second orifice 40.

That participates in the gripping of the lug 28 by the clamp 34.

Figure 4:
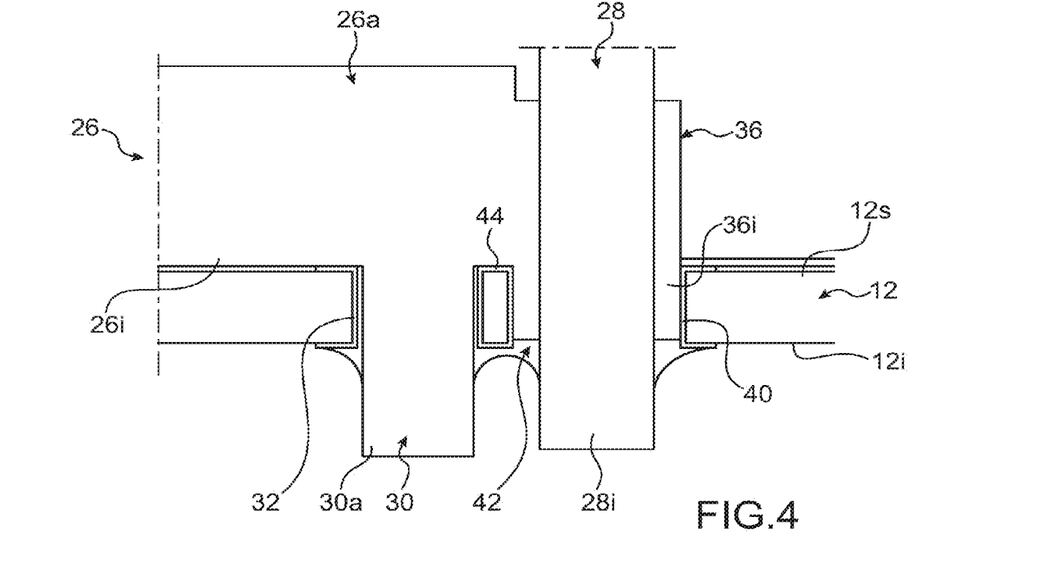
FIG. 4 is a section on a vertical longitudinal plane of the assembled electrical structure.

According to another aspect of the assembly structure, that can be seen in FIG. 4, a continuous layer of solder 42 is deposited on the bottom face 12*i* of the board 12. This layer of solder 42 covers both the foot 30 of the end 26*a* of the bar 26 and the bottom end 28*i* of the lug 28.

Here, the layer of solder 42 is also in contact with the bottom end 36*i* of each hook 36.

The layer of solder 42 is, as is known, produced in an electrically conducting material.

This layer of solder 42 therefore produces the fixing of the foot 30 (and therefore of the end 26*a* of the bar 26) and of the lug 28 onto the board 12. This indirect mechanical link of the end 26*a* of the bar 26 with the lug 28 complements the mechanical link of the end 26*a* of the bar 26 with the lug 28 via the clamp 34.

The layer of solder also produces a second electrical link of the end 26*a* of the bar 26 with the lug 28, which complements the electrical link of the end 26*a* of the bar 26 with the lug 28 produced at the clamp 34.

In order to further improve the electrical link between the end 26*a* of the bar 26 and the lug 28, the board 12 comprises a continuous layer of conducting material 44 which covers the bottom face 12*i* of the board 12, which surrounds the openings of the first orifice 32 and of the second orifice 40. As a variant, the layer of conducting material 44 also covers the internal cylindrical wall of the first orifice 32, the internal cylindrical wall of the second orifice 40, and a part of the top face 12*s* of the board 12.

This layer of conducting material 44 is then simultaneously in electrical contact with the end 26*a* of the bar 26, its foot 30, the hooks 36 of the clamp 34 and the layer of solder 42.

Figure 5:
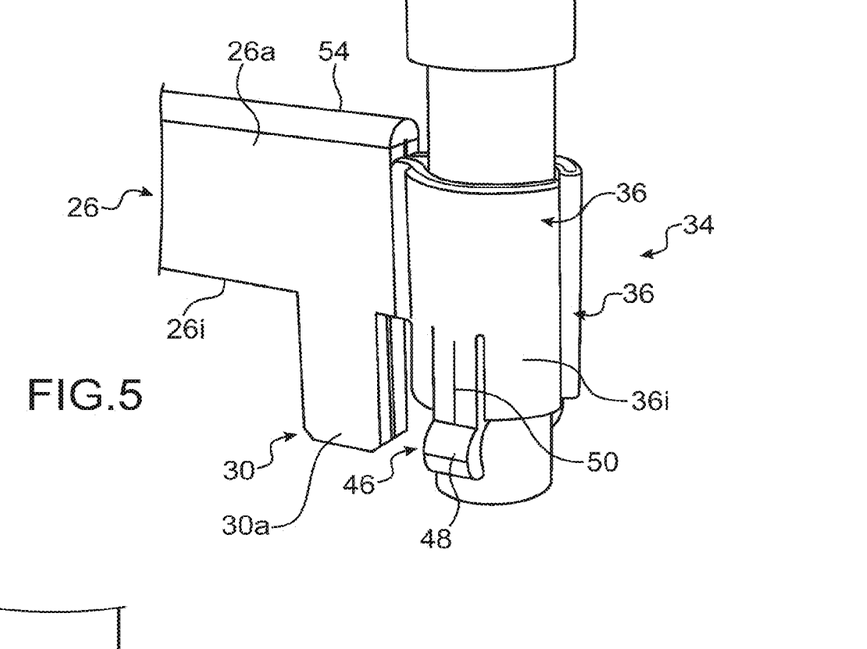
FIGS. 5 and 6 are schematic representations of a variant embodiment of the invention in which the clamp bears locking lugs.
Figure 6:
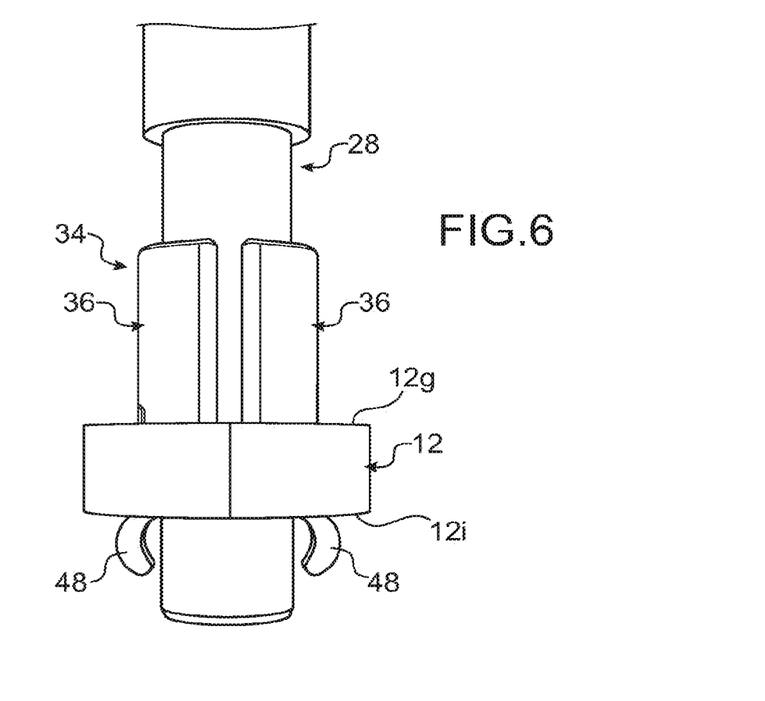

FIGS. 5 and 6 show a variant embodiment of the bulbar according to which the clamp 34 comprises locking tongues 46 for locking the end 26*a* of the bar 26 on the board 12.

Each locking tongue 46 extends vertically downward from a hook 36 of the clamp 34 and the free bottom end 48 of each locking tongue 46 is bent back to protrude transversely outward relative to the associated hook 36, as can be seen more particularly in FIG. 6.

Each locking tongue 46 comprises a vertical arm 50 linking the bottom end 48 of the locking tongue 46 to the rest of the hook 36, which is preferably produced by cutting or shaping of the arm 50.

When the end 26*a* of the bar 26 is mounted on the board 12, the locking tongues 46 are deformed transversely toward the interior of the housing 38, to allow the clamp 34 to pass through the second orifice 40.

Then, the locking tongues 46 resume their initial form relative to the hooks 36.

As can be seen in FIG. 6, when the bar 26 is in position mounted on the board 12, the bottom ends 48 of the locking tongues 46 are situated below the bottom face 12*i* of the board 12.

Next, the lug 28 of the component is introduced into the clamp 34.

From this moment, the lug 28 of the component prevents the locking tongues 46 from being deformed transversely toward the interior of the housing 38.

The locking tongues 46 then come into upward abutment against the bottom face 12*i* of the board 12 when the end 26*a* of the bar 26 is pulled upward, thus preventing the end 26*a* of the bar 26 from being displaced upward.

According to a preferred embodiment, each bar 26 is produced from two symmetrical and parallel half-bars 52, which are attached against one another by their facing vertical faces and which are linked by their respective top edges.

Thus, when the bar 26 is rectilinear, or before it is folded on the board 12, as is the case notably according to the embodiment represented in FIG. 3, the two half-bars 52 are symmetrical relative to a median vertical longitudinal plane of the bar 26 and are attached to one another by their facing longitudinal vertical faces.

According to a variant, a slight transverse gap is present between the two half-bars 52. This gap allows a circulation of air between the half-bars 52 and consequently improves the cooling of the bar 26.

The two half-bars 52 are linked together at their longitudinal top edge by a fold line 54.

Figures 8A, 8B, 8C:
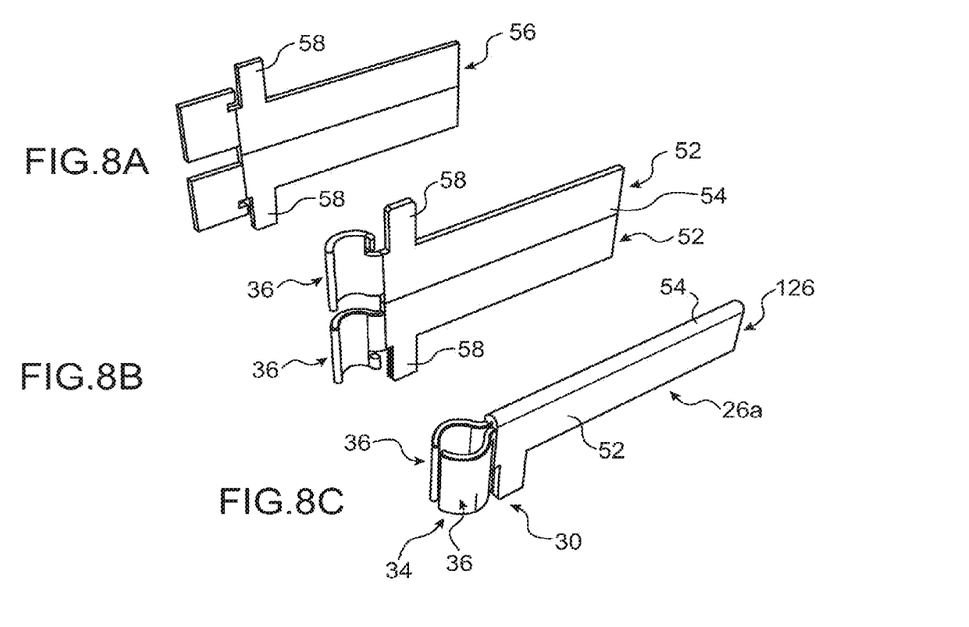
FIGS. 8A to 8C are views showing different steps in manufacturing the busbar.

As can be seen in FIGS. 8A to 8C, according to a preferred embodiment of this variant, the bar 26 is produced by cutting and folding, or shaping, a sheet of conducting material.

Thus, according to a first step represented by FIG. 8A, a flank 56 is formed by cutting the steel plate. This flank is symmetrical relative to a longitudinal line which will become the fold line 54. The two parts of the flank 56 situated on either side of the longitudinal line are intended to form the half-bars 52.

This flank already comprises two parts 58 intended to form the foot 30.

Next, according to a second step represented by FIG. 8B, the flank 56 is subjected to a stamping or chasing, notably to shape the hooks 36. The two half-bars 52 are then formed and are distributed on either side of the fold line 54.

Finally, according to a third step represented by FIG. 8C, the bar 26 is formed by folding of the part obtained at the end of the second step, along the fold line 54.

The two half-bars 52 are then attached to one another, the two hooks are associated to form the clamp 34 and the foot 30 is also formed.

It will be understood that this method for producing a bar 26 would apply in the same way for a bar in which the hooks 36 comprise locking tongues 46.

Figure 9:
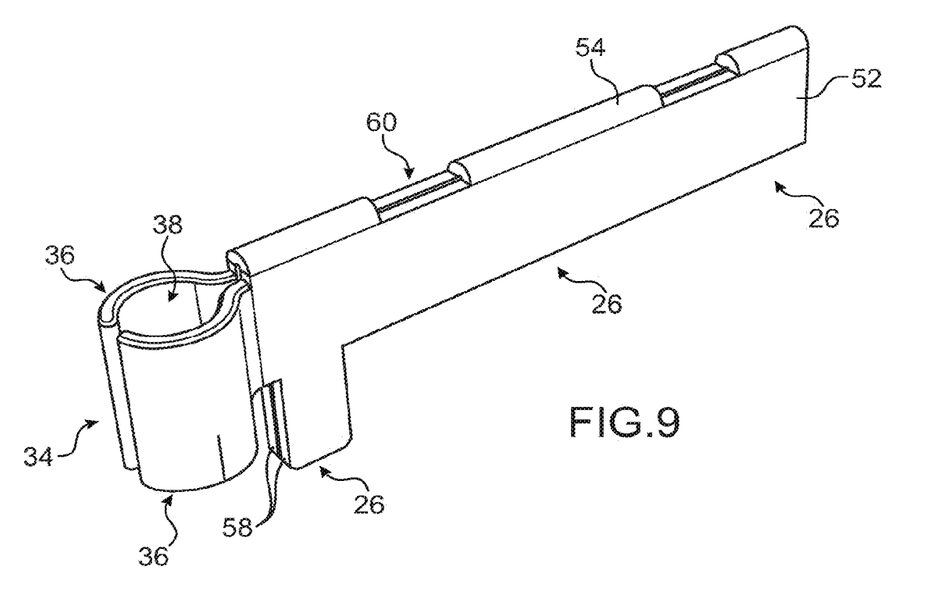
FIG. 9 is a view similar to that of FIG. 8C, showing a variant embodiment of the busbar.

In order to simplify the folding operation, and according to another aspect of this method for manufacturing the bar 26 represented in FIG. 9, the fold line 54 is interrupted, that is to say that it comprises a plurality of windows 60 distributed along the fold line 54.

Insulation means for each bar 26 can be put in place on the module, notably in order to protect the module 10 against any short circuit. This step can be performed before or after the bar 26 is mounted on the board 12.

Figure 7:
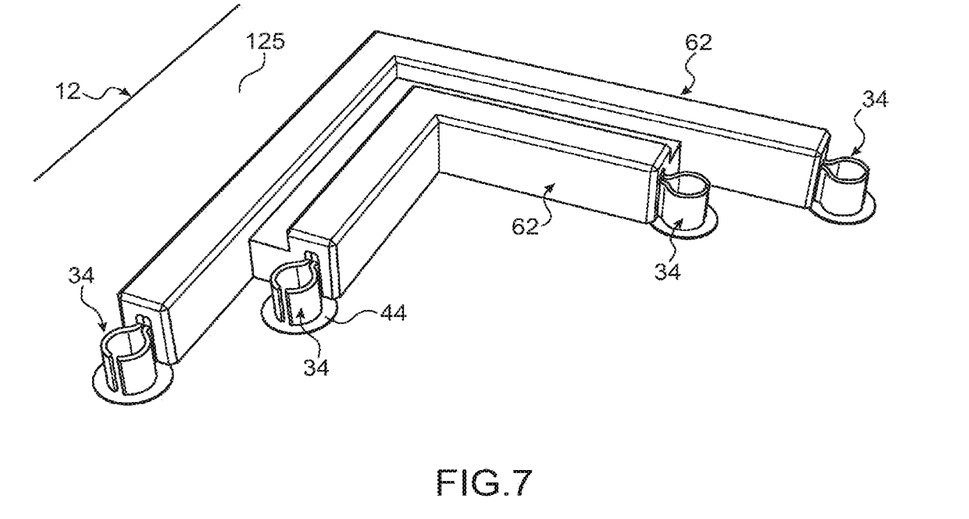
FIG. 7 is a schematic representation of a part of the module showing busbars covered by a layer of insulating material.

For that, as can be seen in FIG. 7, each bar 26 is covered with an insulator 62, which is preferably produced by overmoulding in order to be best matched to the form of the bar 26.

The invention claimed is:

1. A mechanical and electrical connection system comprising:
   a printed circuit board;
   a busbar; and
   an electrical component,
   wherein the printed circuit board includes:
      a first orifice in which a bottom foot of the busbar is received, and
      a second orifice in which a lug of the electrical component is received,
   wherein the busbar includes an elastically deformable clamp which receives the lug of the electrical component, and
   wherein a bottom part of the elastically deformable clamp is received in the second orifice with the lug of the electrical component such that a first part of the elastically deformable clamp is above the second orifice and a second part of the elastically deformable clamp is inside the second orifice, around the lug of the electrical component, the first part of the elastically deformable clamp having a first vertical height greater than a second vertical height of the second part of the elastically deformable clamp.

2. The system according to claim 1, wherein the printed circuit board includes a continuous layer of conducting material formed at the first and second orifices, and which covers at least a bottom face of the printed circuit board, surrounding the openings of the first and second orifices.

3. The system according to claim 2, wherein a part of the continuous layer of conducting material, which covers the bottom face of the printed circuit board, is covered with a solder material.

4. The system according to claim 1, wherein the elastically deformable clamp is made up of at least two hooks jointly delimiting a cylindrical housing and which can be moved apart when the lug is introduced into said cylindrical housing.

5. The system according to claim 4, wherein each said hook includes at least one tongue extending parallel to a main axis of the cylindrical housing, of which a bottom end of each said tongue is situated vertically below a bottom face of the printed circuit board and protrudes outwards relative to the hook.

6. The system according to claim 1, wherein the busbar is made up of two half bars which are distributed on either side of a median vertical longitudinal plane of the busbar and which are linked to one another at their top end edge by a fold line.

7. The system according to claim 6, wherein each half bar includes one of the hooks and one half of a foot.

8. The system according to claim 6, wherein the fold line forms a discontinuous line and includes a plurality of windows distributed longitudinally along the fold line.

9. The system according to claim 6, wherein the busbar is produced by folding a flank of conducting material which has been previously cut and stamped.

10. The system according to claim 1, wherein no part of the elastically deformable clamp extends past a bottom face of the printed circuit board.

* * * * *